United States Patent
Hsu et al.

(10) Patent No.: US 7,338,620 B2
(45) Date of Patent: *Mar. 4, 2008

(54) WATER DISPERSIBLE POLYDIOXYTHIOPHENES WITH POLYMERIC ACID COLLOIDS AND A WATER-MISCIBLE ORGANIC LIQUID

(75) Inventors: Che-Hsiung Hsu, Wilmington, DE (US); Mats Anders Paul Fahlman, Linkoping (SE); Slawomir Jacek Marciniak, Linkoping (SE); William Raymond Salaneck, Linkoping (SE)

(73) Assignee: E.I. du Pont de Nemours and Company, Wilmington, DE (US)

( * ) Notice: Subject to any disclaimer, the term of this patent is extended or adjusted under 35 U.S.C. 154(b) by 666 days.

This patent is subject to a terminal disclaimer.

(21) Appl. No.: 10/802,138

(22) Filed: Mar. 17, 2004

(65) Prior Publication Data

US 2005/0208328 A1 Sep. 22, 2005

(51) Int. Cl.
 H01B 1/12 (2006.01)
 H01B 1/20 (2006.01)
(52) U.S. Cl. .................. 252/500; 528/210
(58) Field of Classification Search ............... 252/500; 528/210; 525/186
 See application file for complete search history.

(56) References Cited

U.S. PATENT DOCUMENTS 4,552,927 A 11/1985 Warren
4,869,979 A * 9/1989 Ohtani et al. ............... 429/213
5,300,575 A 4/1994 Jonas et al.
2004/0102577 A1 * 5/2004 Hsu et al. ................... 525/182

FOREIGN PATENT DOCUMENTS

| EP | 0593111 A1 * | 4/1994 |
| WO | WO 2004/020444 A | 3/2004 |
| WO | WO 2004/029128 A | 4/2004 |
| WO | WO 2004/094501 A | 11/2004 |

OTHER PUBLICATIONS

Pickup et al "Electronically conducting cation-exchange polymer powders . . . ", Journal of New Materials for Electrochemical Systems, 3, 21-26 (2000).*
Hsu, C. -H., Novel Preparation and Properties of Conductive Polyaniline/Nafion(R) Film, Synthetic Metals, 1991, 671-674, 41-43, Elsevier Sequoia, The Netherlands.
A. J. Sharpe, Jr. et al, Improved Cationic Conductive Polymer, Calgon Corp., Pittsburgh, PA. Coating Conference [Proceedings], pp. 83-87, 1981, ISSN 0364-2771.
J.Y. Kim, J.H. Jung, D.E. Lee and J. Joo, "Enhancement of electrical conductivity of poly (3,4-ethylenedioxythiophene)/poly(4-styrenesulfonate) by a change of solvents" in Synthetic Metals, vol. 126, pp. 311-316, Feb. 2002, Elsevier B.V., Lausanne, CH XP001189321 ISSN: 0379-6779.

* cited by examiner

Primary Examiner—Mark Kopec
(74) Attorney, Agent, or Firm—John H. Lamming

(57) ABSTRACT

Aqueous dispersion compositions of polydioxythiophene, polymeric acid colloids, and water-miscible organic liquid and methods of making such compositions. The compositions are useful in organic electronic devices.

11 Claims, 3 Drawing Sheets

WATER DISPERSIBLE POLYDIOXYTHIOPHENES WITH POLYMERIC ACID COLLOIDS AND A WATER-MISCIBLE ORGANIC LIQUID

FIELD OF THE INVENTION

The invention relates to new aqueous dispersions of dioxythiophene, colloid-forming polymeric acid, and water-miscible organic liquids, methods for making and use.

BACKGROUND OF THE INVENTION

Electrically conducting polymers have been used in a variety of organic electronic devices, including in the development of electroluminescent ("EL") devices for use in light emissive displays. With respect to EL devices, such as organic light emitting diodes (OLEDs) containing conducting polymers, such devices generally have the following configuration:

anode/buffer layer/EL material/cathode

The anode is typically any material that is transparent and has the ability to inject holes into the EL material, such as, for example, indium/tin oxide (ITO). The anode is optionally supported on a glass or plastic substrate. EL materials include fluorescent dyes, fluorescent and phosphorescent metal complexes, conjugated polymers, and mixtures thereof. The cathode is typically any material (such as, e.g., Ca or Ba) that has the ability to inject electrons into the EL material.

The buffer layer is typically an electrically conducting polymer and facilitates the injection of holes from the anode into the EL material layer. The buffer layer can also be called a hole-injection layer, a hole transport layer, or may be characterized as part of a bilayer anode. Typical conducting polymers employed as buffer layers include polyaniline and polydioxythiophenes such as poly(3,4-ethylenedioxythiophene) (PEDT). These materials can be prepared by polymerizing aniline or dioxythiophene monomers in aqueous solution in the presence of a water soluble polymeric acid, such as poly(styrenesulfonic acid) (PSS), as described in, for example, U.S. Pat. No. 5,300,575 entitled "Polythiophene dispersions, their production and their use." A well known PEDT/PSS material is Baytron®-P, commercially available from H. C. Starck, GmbH (Leverkusen, Germany).

The aqueous electrically conductive polymer dispersions synthesized with water soluble polymeric sulfonic acids have undesirable low pH levels. The low pH can contribute to decreased stress life of an EL device containing such a buffer layer, and contribute to corrosion within the device. Accordingly, there is a need for compositions and layers prepared there from having improved properties.

Electrically conducting polymers which have the ability to carry a high current when subjected to a low electrical voltage, also have utility as electrodes for electronic devices, such as thin film field effect transistors. In such transistors, an organic semiconducting film which has high mobility for electron and/or hole charge carriers, is present between source and drain electrodes. A gate electrode is on the opposite side of the emiconducting polymer layer. To be useful for the electrode application, the electrically conducting polymers and the liquids for dispersing or dissolving the electrically conducting polymers have to be compatible with the semiconducting polymers and the solvents for the semiconducting polymers to avoid re-dissolution of either conducting polymers or semiconducting polymers. The electrical conductivity of the electrodes fabricated from the electrically conducting polymers should be greater than 10 S/cm (where S is a reciprocal ohm). However, the electrically conducting polythiophenes made with a polymeric acid typically provide conductivity in the range of ~$10^{-3}$ S/cm or lower. In order to enhance conductivity, conductive additives may be added to the polymer. However, the presence of such additives can deleteriously affect the processability of the electrically conducting polythiophene. Accordingly, there is a need for improved conductive polythiophenes with good processability and increased conductivity.

There is a continuing need for conductive polymer compositions.

SUMMARY OF THE INVENTION

A new aqueous dispersion composition comprising:
water,
a polydioxythiophene,
a colloid-forming polymeric acid, and
a water-miscible organic liquid, wherein the weight ratio of organic liquid to total polymer is at least 0.1.

A method for producing an aqueous dispersion comprising water, a polydioxythiophenes, a colloid-forming polymeric acid, and a water-miscible organic liquid, comprising:
 (a) providing an aqueous mixture of water and at least one dioxythiophene monomer;
 (b) providing an aqueous dispersion of the polymeric acid;
 (c) combining the dioxythiophene mixture with the aqueous dispersion of colloid-forming polymeric acid,
 (d) combining an oxidizing agent and a catalyst, in any order, with the aqueous dispersion of the colloid-forming polymeric acid before or after the combining of step (c), and
 (e) adding at least one water-miscible organic liquid, wherein the weight ratio of organic liquid to total polymer is at least about 0.1.

In addition to the new compositions and method, an organic electronic device comprising at least one layer comprising the new composition is provided.

The foregoing general description and the following detailed description are exemplary and explanatory only and are not restrictive of the invention, as defined in the appended claims.

BRIEF DESCRIPTION OF THE FIGURES

The invention is illustrated by way of example and not limitation in the accompanying figures.

DETAILED DESCRIPTION OF THE INVENTION

Figure 1:
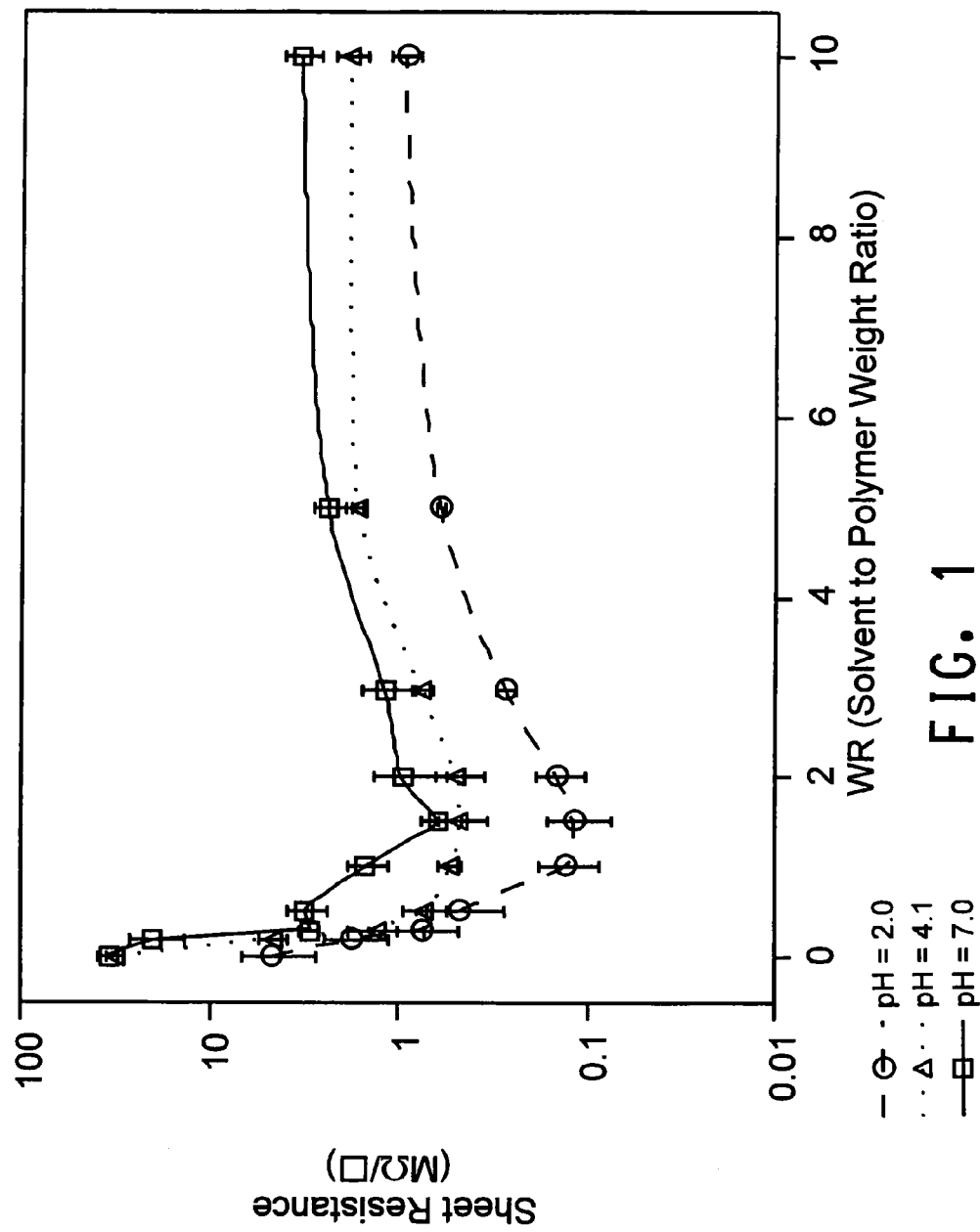
FIG. 1 illustrates one use of the new composition is a plot of sheet resistance of layers made from new composition described above and in this embodiment, the composition comprised an aqueous dispersions of poly(ethylenedioxythiophene) ("PEDT"), polymeric perfluoroethylenesulfonic acid colloids having different amounts of di-ethylene glycol ("DEG") as the water-miscible organic liquid.

A new aqueous dispersion composition comprising:
water,
a polydioxythiophene,
a colloid-forming polymeric acid, and
a water-miscible organic liquid,
wherein the weight ratio of organic liquid to total polymer is at least 0.1.

A method for producing an aqueous dispersion comprising water, a polydioxythiophenes, a colloid-forming polymeric acid, and a water-miscible organic liquid, comprising:
 (a) providing an aqueous mixture of water and at least one dioxythiophene monomer;
 (b) providing an aqueous dispersion of the polymeric acid;
 (c) combining the dioxythiophene mixture with the aqueous dispersion of colloid-forming polymeric acid,
 (d) combining an oxidizing agent and a catalyst, in any order prior to the addition of at least one water-miscible organic liquid with the aqueous dispersion of the colloid-forming polymeric acid before or after the combining of step (c), and
 (e) adding the at least one water-miscible organic liquid, wherein the weight ratio of organic liquid to total polymer is at least about 0.1.

In one embodiment the aqueous mixture of water and a dioxythiophene is homogeneous.

In one embodiment at least two dioxythiopenes are used. In one embodiment at least two colloid-forming polymeric acids are used. In one embodiment, at least two water-miscible organic liquids are used.

In one embodiment, the water-miscible organic liquid comprises a polar organic solvent.

In one embodiment, an organic electronic device comprising at least one layer comprising the new composition is a continuous film deposited by any solution processing technique or combinations of techniques. In one embodiment, the organic electronic device comprises at least one layer comprising the new composition and at least one layer is a buffer layer.

The term "layer" or "film" refers to a coating covering a desired area. The area can be as large as an entire device or as small as a specific functional area such as the actual visual display area when used in the fabrication of an organic light emitting display, or as small as a single sub-pixel. Films can be formed by any conventional deposition technique, including vapor deposition and liquid deposition. Typical liquid deposition techniques include, but are not limited to, continuous deposition techniques such as spin coating, gravure coating, curtain coating, dip coating, slot-die coating, spray-coating, and continuous nozzle coating; and discontinuous deposition techniques such as ink jet printing, gravure printing, and screen printing.

As used herein, the term "dispersion" refers to a continuous liquid medium containing a suspension of minute particles. In accordance with the invention, the "continuous medium" is typically an aqueous liquid, e.g., water. As used herein, the term "aqueous" refers to a liquid that has water in major portion. As used herein, the term "colloid" refers to the minute particles suspended in the continuous medium, said particles having a nanometer-scale particle size. As used herein, the term "colloid-forming" refers to substances that form minute particles when dispersed in aqueous solution, i.e., "colloid-forming" polymeric acids are not water-soluble. As used herein, the term "total polymer" refers to the total amount of polydioxythiophene and colloid-forming polymeric acid. As used herein, the term "water-miscible" means a liquid that can be added to water without resulting in the formation of a separate phase.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

As used herein, the following terms for substituent groups refer to the formulae given below:

| | |
|---|---|
| "alcohol" | —$R^3$—OH |
| "amidosulfonate" | —$R^3$—C(O)N($R^6$)$R^4$—$SO_3$Z |
| "benzyl" | —$CH_2$—$C_6H_5$ |
| "carboxylate" | —$R^3$—C(O)O—Z |
| "ether" | —$R^3$—O—$R^5$ |
| "ether carboxylate" | —$R^3$—O—$R^4$—C(O)O—Z |
| "ether sulfonate" | —$R^3$—O—$R^4$—$SO_3$Z |
| "sulfonate" | —$R^3$—$SO_3$Z |
| "urethane" | —$R^3$—O—C(O)—N($R^6$)$_2$ | where all "R" groups are the same or different at each occurrence and:
$R^3$ is a single bond or an alkylene group
$R^4$ is an alkylene group
$R^5$ is an alkyl group
$R^6$ is hydrogen or an alkyl group
Z is H, alkali metal, alkaline earth metal, N($R^5$)$_4$ or $R^5$ Any of the above groups may further be unsubstituted or substituted, and any group may have F substituted for one or more hydrogens, including perfluorinated groups As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Examples of suitable water-miscible organic liquids include, but are not limited to glycols, glycol ethers, alcohols, alcohol ethers, cyclic ethers, ketones, nitriles, sulfoxides, amides, and combinations thereof. In one embodiment, the organic liquid has a boiling point greater than about 100° C. In one embodiment, the organic liquid comprises at least one glycol, glycol ether, cyclic ether, sulfoxide, amide, and combinations thereof. In one embodiment, the organic liquid comprises at least one N-methylpyrrolidone, ethylene glycol, dimethylacetamide, dimethyl formamide, dimethylsulfoxide, or combinations thereof.

The amount of liquid added can be described in terms of the weight ratio ("WR"), which is the weight of organic liquid divided by the weight of total polymer in the dispersion. In one embodiment, the organic liquid is present with a WR of at least about 0.1. In one embodiment, the organic liquid is present with a WR in the range of about 0.3 to 5.0. In one embodiment, the organic liquid is present with a WR in the range of about 0.5 to 3.0. In one embodiment, the organic liquid is present with a WR in the range of about 1.0 to 2.0. The specific amount of the water-miscible organic liquid comprised with the new composition can be adjusted to affect the desired conductivity.

In one embodiment, the water-miscible organic liquid comprises di-ethylene glycol ("DEG"). In one embodiment, the amount of organic liquid is the amount that achieves the maximum conductivity. For example, one way to determine the maximum conductivity of the new composition is illustrated in FIG. 1, which illustrates a maximum in conductivity at a specific amount of DEG added. After this amount, the addition of organic liquid results in a decrease in conductivity. This can be seen in FIG. 1, where sheet resistance is shown vs. the WR of DEG. A WR as low as about 0.3 results in an increase in conductivity (reduction of sheet resistance). The maximum conductivity (minimum of electrical resistance across the sheet as measured by any conventional resistance measuring techniques ("sheet resistance") is obtained for WR of about 1.5. Above WR of about 1.5, the conductivity begins to decrease. As can also be seen in FIG. 1, the effect is seen at different levels of acidity of the new composition as well.

In one embodiment, a layer comprising at least one of the new compositions is used in an organic electronic device is further heat treated prior to the device fabrication steps involving heat sensitive materials. In one embodiment, the heat treatment is to a temperature of at least 40° C. In one embodiment, the layer is heated to a temperature of at least 60° C. In one embodiment, the layer is heated to a temperature of at least 80° C.

Figure 2:
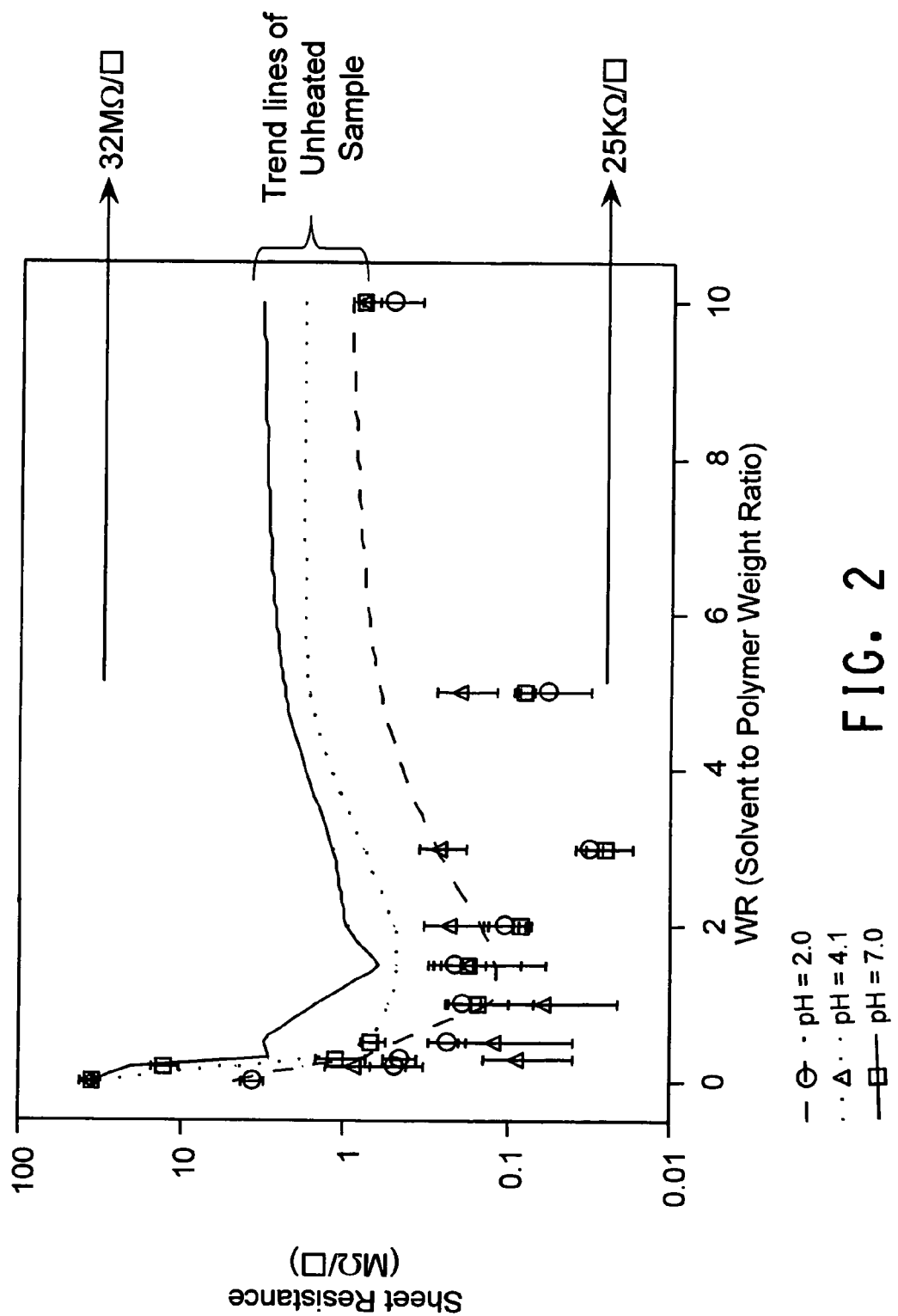
FIG. 2 is a plot of sheet resistance of heat-treated films, created through a spin-coating the new composition, wherein in the example the new composition comprises an PEDT, polymeric perfluoroethylenesulfonic acid colloids, water and having different amounts of DEG.

FIG. 2 shows sheet resistance as a function of WR of DEG, after the sheets were heated at 80° C. for 20 minutes. The WR for the maximum conductivity is still in the vicinity of about 1.5 to 2. The maximum conductivity is higher in the heated films than in the unheated films. Thus heating the films can also increase the conductivity.

One embodiment of preparing the new composition comprises selecting the acidity of the polydioxythiophene/polymeric acid colloids in view of its compatibility with the device component to which it is deposited or applied, without considering conductivity. In one embodiment, the new composition can have its conductivity adjusted by the addition of the appropriate amount of organic liquid and/or conductivity additives as further described herein.

Polydioxythiophenes contemplated for use in the practice of the present invention have the structure:

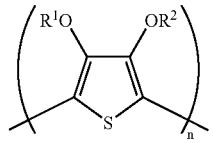

wherein:
R$^1$ and R$^2$ are each independently selected from hydrogen, an alkyl having at least one carbon atom,
or R$^1$ and R$^2$ taken together form an alkylene chain having at least one carbon atom, which may optionally be substituted byaryl, heteroaryl, alkyl, heteroalkyl, alkenyl, heteroalkenyl, alcohol, amidosulfonate, benzyl, carboxylate, ether, ether carboxylate, ether sulfonate, sulfonate, and urethane, and n is at least about 4.

In a particular embodiment, R$^1$ and R$^2$ taken together form an alkylene chain having 1 to 4 carbon atoms. In another embodiment, the polydioxythiophene is poly(3,4-ethylenedioxythiophene). The polydioxythiophenes can be homopolymers, or they can be copolymers of two or more dixoxythiophene monomers. The new composition may comprise one or more than one polydioxythiophene polymer and one or more than one colloid-forming polymeric acid.

Colloid-forming polymeric acids contemplated for use in the practice of the invention are insoluble in water, and form colloids when dispersed into an aqueous medium and the colloid-forming polymeric acid is the polymeric acid colloids which exist as colloidal dispersion in fluids. The polymeric acids typically have a molecular weight in the range of about 10,000 to about 4,000,000. In one embodiment, the polymeric acids have a molecular weight of about 100,000 to about 2,000,000. Colloid particle size typically ranges from 2 nanometers (nm) to about 140 nm. In one embodiment, the new composition comprises polymeric acid colloids have a particle size of about 2 nm to about 30 nm. Any polymeric acid that is colloid-forming when dispersed in water is suitable for use in the practice of the invention. In one embodiment, the colloid-forming polymeric acid comprises at least one polymeric sulfonic acid. Other acceptable polymeric acids include polymer phosphoric acids, polymer carboxylic acids, polymeric acrylic acids, and mixtures thereof, including mixtures having polymeric sulfonic acids. In another embodiment, the polymeric sulfonic acid is fluorinated. In still another embodiment, the colloid-forming polymeric sulfonic acid is perfluorinated. In yet another embodiment, the colloid-forming polymeric sulfonic acid is a perfluoroalkylenesulfonic acid.

In still another embodiment, the colloid-forming polymeric acid is a highly-fluorinated sulfonic acid polymer ("FSA polymer"). "Highly fluorinated" means that at least about 50% of the total number of halogen and hydrogen atoms in the polymer are fluorine atoms, an in one embodiment at least about 75%, and in another embodiment at least about 90%. In one embodiment, the polymer is perfluorinated. The term "sulfonate functional group" refers to either to sulfonic acid groups or salts of sulfonic acid groups, and in one embodiment alkali metal or ammonium salts. The functional group is represented by the formula —SO$_3$X where X is a cation, also known as a "counterion". X may be H, Li, Na, K or N(R$_1$)(R$_2$)(R$_3$)(R$_4$), and R$_1$, R$_2$, R$_3$, and R$_4$ are the same or different and are and in one embodiment H, CH$_3$ or C$_2$H$_5$. In another embodiment, X is H, in which case the polymer is said to be in the "acid form". X may also be multivalent, as represented by such ions as Ca$^{++}$, and Al$^{+++}$. It is clear to the skilled artisan that in the case of multivalent counterions, represented generally as M$^{n+}$, the number of sulfonate functional groups per counterion will be equal to the valence "n".

In one embodiment, the FSA polymer comprises a polymer backbone with recurring side chains attached to the backbone, the side chains carrying cation exchange groups. Polymers include homopolymers or copolymers of two or more monomers. Copolymers are typically formed from a nonfunctional monomer and a second monomer carrying the cation exchange group or its precursor, e.g., a sulfonyl fluoride group (—SO$_2$F), which can be subsequently hydrolyzed to a sulfonate functional group. For example, copolymers of a first fluorinated vinyl monomer together with a second fluorinated vinyl monomer having a sulfonyl fluoride group (—SO$_2$F) can be used. Possible first monomers include tetrafluoroethylene (TFE), hexafluoropropylene, vinyl fluoride, vinylidine fluoride, trifluoroethylene, chlorotrifluoroethylene, perfluoro(alkyl vinyl ether), and combinations thereof. TFE is a preferred first monomer.

In other embodiments, the new compositions comprise two or more monomers having fluorinated vinyl ethers with sulfonate functional groups or precursor groups which can provide the desired side chain in the polymer. Additional monomers, including ethylene, propylene, and R—CH=CH$_2$ where R is a perfluorinated alkyl group of 1 to 10 carbon atoms, can be incorporated into these polymers if desired. The polymers may be of the type referred to herein as random copolymers, that is copolymers made by polymerization in which the relative concentrations of the comonomers are kept as constant as possible, so that the distribution of the monomer units along the polymer chain is in accordance with their relative concentrations and relative reactivities. Less random copolymers, made by varying relative concentrations of monomers in the course of the polymerization, may also be used. Polymers of the type called block copolymers, such as that disclosed in European Patent Application No. 1 026 152 A1, may also be used.

In one embodiment, FSA polymers for use in the present invention include a highly fluorinated, and in one embodiment perfluorinated, carbon backbone and side chains represented by the formula —(O—CF$_2$CFR$_f$)$_a$—O—CF$_2$CFR'$_f$SO$_3$X wherein Rf and R'f are independently selected from F, Cl or a perfluorinated alkyl group having 1 to 10 carbon atoms, a = 0, 1 or 2, and X is H, Li, Na, K or N(R1)(R2)(R3)(R4) and R1, R2, R3, and R4 are the same or different and are and in one embodiment H, CH$_3$ or C$_2$H$_5$. In another embodiment X is H. As stated above, X may also be multivalent.

In one embodiment, the FSA polymers include, for example, polymers disclosed in U.S. Pat. No. 3,282,875 and in U.S. Pat. Nos. 4,358,545 and 4,940,525. An example of preferred FSA polymer comprises a perfluorocarbon backbone and the side chain represented by the formula

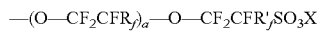
—O—CF$_2$CF(CF$_3$)—O—CF$_2$CF$_2$SO$_3$X where X is as defined above. FSA polymers of this type are disclosed in U.S. Pat. No. 3,282,875 and can be made by copolymerization of tetrafluoroethylene (TFE) and the perfluorinated vinyl ether CF$_2$=CF—O—CF$_2$CF(CF$_3$)—O—CF$_2$CF$_2$SO$_2$F, perfluoro(3,6-dioxa4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain —O—CF$_2$CF$_2$SO$_3$X, wherein X is as defined above. This polymer can be made by copolymerization of tetrafluoroethylene (TFE) and the perfluorinated vinyl ether CF$_2$=CF—O—CF$_2$CF$_2$SO$_2$F, perfluoro(3-oxa-4-pentenesulfonyl fluoride) (POPF), followed by hydrolysis and further ion exchange as necessary.

In one embodiment, the FSA polymers for use in this invention typically have an ion exchange ratio of less than about 33. In this application, "ion exchange ratio" or "IXR" is defined as number of carbon atoms in the polymer backbone in relation to the cation exchange groups. Within the range of less than about 33, IXR can be varied as desired for the particular application. In one embodiment, the IXR is about 3 to about 33, and in another embodiment about 8 to about 23.

The cation exchange capacity of a polymer is often expressed in terms of equivalent weight (EW). For the purposes of this application, equivalent weight (EW) is defined to be the weight of the polymer in acid form required to neutralize one equivalent of sodium hydroxide. In the case of a sulfonate polymer where the polymer has a perfluorocarbon backbone and the side chain is —O—CF$_2$—CF(CF$_3$)—O—CF$_2$—CF$_2$—SO$_3$H (or a salt thereof, the equivalent weight range which corresponds to an IXR of about 8 to about 23 is about 750 EW to about 1500 EW. IXR for this polymer can be related to equivalent weight using the formula: 50 IXR+344=EW. While the same IXR range is used for sulfonate polymers disclosed in U.S. Pat. Nos. 4,358,545 and 4,940,525, e.g., the polymer having the side chain —O—CF$_2$CF$_2$SO$_3$H (or a salt thereof), the equivalent weight is somewhat lower because of the lower molecular weight of the monomer unit containing a cation exchange group. For the preferred IXR range of about 8 to about 23, the corresponding equivalent weight range is about 575 EW to about 1325 EW. IXR for this polymer can be related to equivalent weight using the formula: 50 IXR+178=EW.

The FSA polymers can be prepared as colloidal aqueous dispersions. They may also be in the form of dispersions in other media, examples of which include, but are not limited to, alcohol, water-soluble ethers, such as tetrahydrofuran, mixtures of water-soluble ethers, and combinations thereof. However, the co-dispersing liquid in the FSA polymers may be optionally removed before or after polymerization of thiophene for addition of a polar organic liquid in this invention. In making the dispersions, the polymer can be used in acid form. U.S. Pat. Nos. 4,433,082, 6,150,426 and WO 03/006537 disclose methods for making of aqueous alcoholic dispersions. After the dispersion is made, concentration and the dispersing liquid composition can be adjusted by methods known in the art.

Aqueous dispersions of the colloid-forming polymeric acids, including FSA polymers, typically have particle sizes as small as possible and an EW as small as possible, so long as a stable colloid is formed.

Aqueous dispersions of FSA polymer are available commercially as Nafion® dispersions, from E. I. du Pont de Nemours and Company (Wilmington, Del.).

In one embodiment, the new compositions are oxidatively polymerized in the presence of at least one polymeric acid colloids. In one embodiment, the dioxythiophene monomers are combined with or added to an aqueous dispersion of at least one polymeric acid colloid dispersion further comprising a polymerization catalyst, an oxidizing agent. In one embodiment, the order of combination or addition may vary provided that the oxidizing agent and catalyst is not combined with the monomer until one is ready for the polymerization reaction to proceed.

Polymerization catalysts include, but are not limited to, ferric sulfate, ferric chloride, and the like and mixtures thereof.

Oxidizing agents include, but are not limited to, sodium persulfate, potassium persulfate, ammonium persulfate, and the like, including combinations thereof. In one embodiment, the oxidative polymerization results in a stable, aqueous dispersion containing positively charged conductive polymeric dioxythiophene that is charged balanced by the negatively charged side chains of the polymeric acids contained within the colloids, for example, sulfonate anion, carboxylate anion, acetylate anion, phosphonate anion, combinations, and the like.

In one embodiment the polymerization is carried out by: (a) providing an aqueous dispersion of a polymer acid; (b) adding an oxidizing agent to the dispersion of step (a); (c) adding a catalyst to the dispersion of step (b); and (d) adding a dioxythiophene monomer to the dispersion of step (c). One alternative embodiment to the above described method includes adding the dioxythiophene monomer to the aqueous dispersion of a polymeric acid prior to adding the oxidizing agent.

In another embodiment, a homogenous aqueous mixture of water and at least one dioxythiophene is created. In one embodiment the dioxythiophene concentrations in water which is in the range of about 0.5% by weight to about 2.0% by weight dioxythiophene. In one embodiment the dioxythiophene mixture is added to the aqueous dispersion of the polymeric acid before adding the oxidizing agent and catalyst.

The polymerization can be carried out in the presence of a co-acid. The co-acid can be an inorganic acid, such as HCl, sulfuric acid, and the like, or an organic acid, such as p-toluenesulfonic acid, dodecylbenzenesulfonic acid, methanesulfonic acid, trifluoromethanesulfonic acid, camphorsulfonic acid, acetic acid and the like. Additional suitable co-acids include water soluble polymeric acid such as poly(styrenesulfonic acid), poly(2-acrylamido-2-methyl-1-propanesulfonic acid, or the like, or a second colloid-forming acid, as described above. Combinations of the above mentioned co-acids can be used.

The co-acid can be added to the reaction mixture at any point in the process prior to the addition of either the oxidizing agent or the dioxythiophene monomer, whichever is added last. In one embodiment, the co-acid is added before both the dioxythiophene monomer and the colloid-forming polymeric acid, and the oxidizing agent is added last. In one embodiment the co-acid is added prior to the addition of the dixoythiophene monomer, followed by the addition of the colloid-forming polymeric acid, and the oxidizing agent is added last.

After completion of any of the methods described above and completion of the polymerization reaction, the aqueous dispersion is contacted with at least one ion exchange resin under conditions suitable to produce a stable, aqueous dispersion. In one embodiment, the aqueous dispersion is contacted with a first ion exchange resin and a second ion exchange resin.

In another embodiment, the first ion exchange resin is an acidic, cation exchange resin, such as a sulfonic acid cation exchange resin set forth above, and the second ion exchange resin is a basic, anion exchange resin, such as a tertiary amine or a quaternary exchange resin.

Ion exchange is a reversible chemical reaction wherein an ion in a fluid medium (such as an aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as acidic, cation exchangers, which have positively charged mobile ions available for exchange, and basic, anion exchangers, whose exchangeable ions are negatively charged.

Both acidic, cation exchange resins and basic, anion exchange resins are contemplated for use in the practice of the invention. In one embodiment, the acidic, cation exchange resin is an organic acid, cation exchange resin, such as a sulfonic acid cation exchange resin. Sulfonic acid cation exchange resins contemplated for use in the practice of the invention include, for example, sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin is an organic acid, cation exchange resin, such as carboxylic acid, acrylic or phosphoric acid cation exchange resin. In addition, mixtures of different cation exchange resins can be used. In many cases, the basic ion exchange resin can be used to adjust the pH to the desired level. In some cases, the pH can be further increased with an aqueous basic solution such as a solution of sodium hydroxide, ammonium hydroxide, tetra-methylammonium hydroxide, or the like. In other cases the pH can be further reduced with acidic ion-exchange resins for the applications where high acidity is not an issue.

In another embodiment, the basic, anionic exchange resin is a tertiary amine anion exchange resin. Tertiary amine anion exchange resins contemplated for use in the practice of the invention include, for example, tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin is a quaternary amine anion exchange resin, or mixtures of these and other exchange resins.

The first and second ion exchange resins may contact the aqueous dispersion either simultaneously, or consecutively. For example, in one embodiment both resins are added simultaneously to an aqueous dispersion of an electrically conducting polymer, and allowed to remain in contact with the dispersion for at least about 1 hour, e.g., about 2 hours to about 20 hours. The ion exchange resins can then be removed from the dispersion by filtration. The size of the filter is chosen so that the relatively large ion exchange resin particles will be removed while the smaller dispersion particles will pass through. Without wishing to be bound by theory, it is believed that the ion exchange resins quench polymerization and effectively remove ionic and non-ionic impurities and most of unreacted monomer from the aqueous dispersion. Moreover, the basic, anion exchange and/or acidic, cation exchange resins renders the acidic sites more basic, resulting in increased pH of the dispersion. In general, at least 1 gram of ion exchange is used per about 1 gram of colloid-forming polymeric acid. In other embodiments, the use of the ion exchange resin is used in a ratio of up to about 5 grams of ion exchange resin to polythiophene/polymeric acid colloid and depends on the pH that is to be achieved. In one embodiment, about one gram of Lewatit® MP62 WS, a weakly basic anion exchange resin from Bayer GmbH, and about one gram of Lewatit® MonoPlus S100, a strongly acidic, sodium cation exchange resin from Bayer, GmbH, are used per gram of the composition of polydioxythiophene and at least one colloid-forming polymeric acid.

In one embodiment, the aqueous dispersion resulting from polymerization of dioxythiophene with fluorinated polymeric sulfonic acid colloids is to charge a reaction vessel first with an aqueous dispersion of the fluorinated polymer and then the order of addition is to add the oxidizing agent, catalyst and dioxythiophene monomer. In another embodiment, the order of addition is to add the dioxythiophene monomer, the oxidizing agent and catalyst to the aqueous dispersion of the colloid forming polymer. With either embodiment, the mixture is stirred and the reaction is then allowed to proceed at a controlled temperature. In one embodiment, when polymerization is completed, the reaction is quenched with a strong acid cation resin and a base anion exchange resin, stirred and filtered. In one embodiment, the dioxythiophene is first added to added to water and stirred to until a homogenize the mixture is created. In one embodiment, this homogenous mixture is created prior to addition of fluorinated polymeric sulfonic acid, e.g., Nafion® dispersion, followed with oxidizing agent and catalyst. In one embodiment, oxidizing agent monomer ratio is generally in the range of about 0.5 to 2.0 In one embodiment, the fluorinated polymer: dioxythiophene monomer ratio is generally in the range of about 1 to 4. The overall solid content is generally in the range of about 1.5% to 6%; and in one embodiment about 2% to 4.5%. The reaction temperature is generally in the range of about 5° C. to 50° C.; and in one embodiment about 20° C. to 35° C. The reaction time is generally in the range of 1 to 30 hours.

The new compositions can have a wide variation in pH. In one embodiment, the new composition has a pH of between about 1 to about 8,; and in one embodiment the pH is about 3-4. It has been found that the pH can be adjusted using known techniques, for example, ion exchange or by titration with an aqueous basic solution.

In at least one embodiment wherein the pH is about 7-8, the new compositions have been found to have improved surface smoothness. In one such embodiment, fluorinated polymeric sulfonic acid colloids with a pH up to 7-8 have been used to form the new composition. In other embodiments, the aqueous dispersions of at least one dioxythiophene, water-miscible organic liquid, other colloid-forming polymeric acids can be similarly treated to adjust the pH.

In another embodiment, the new compositions further comprise conductive additives. In one embodiment the new composition further comprising the conductive additives and has a neutral to basic pH. In one embodiment, the conductive additives comprise at least one metal additive.

In one embodiment, the new composition further comprises only a low weight percentage of conductive additives. In another embodiment, the new composition comprising at least one conductive additive at weight percentage of an amount only to the extent needed to reach the percolation threshold. Examples of suitable conductive additives include, but are not limited to metal particles and nanoparticles, nanowires, carbon nanotubes, carbon nanoparticles, graphite fibers or particles, carbon particles, conductive polymers and combinations thereof. Conductive polymers include, but not limited to, polythiophenes, polyanilines, polypyrroles, and polyacetylenes.

In one embodiment, the colloid-forming polymeric acid is a polymeric sulfonic acid. In one embodiment, the new composition comprises poly(alkylenedioxythiophene) and fluorinated polymeric acid colloids. In another embodiment, the fluorinated polymeric acid colloids are fluorinated polymeric sulfonic acid colloids. In still another embodiment, the new composition comprises an aqueous dispersion containing poly(3,4-ethylenedioxythiophene) and perfluoroethylenesulfonic acid colloids.

In one embodiment, the dried layers made from the new composition are generally not redispersible in water. Thus layers comprising the new compositions often can used in an active layer of an organic electronic device and can be applied as multiple thin layers. In addition, layers comprising the new composition may be overcoated or have further deposition materials place thereon and such additional layers may include different water-soluble or water-dispersible material without causing substantial performance related damage to the layer comprising the new composition, In another embodiment, the new compositions are blended with other water soluble or dispersible materials. Depending on the final application of the material, examples of types of additional water soluble or dispersible materials which can be added include, but are not limited to polymers, dyes, coating aids, carbon nanotubes, nanowires, organic and inorganic conductive inks and pastes, semiconductive or insulating inorganic oxide nano-particles, piezoelectric, pyrroelectric or ferroelectric oxid nano-particles or polymers, phtoconductive oxide nano-particles or polymers, charge transport materials, crosslinking agents, and combinations thereof. The materials can be simple molecules or polymers. Examples of suitable other water soluble or dispersible polymers include, but are not limited to, polythiophenes, polyanilines, polyamines, polypyrroles, polyacetylenes, polyvinylalcohol, poly(2-vinylpridine), poly(vinylacetate), poly(vinylmethylether), poly(vinylpyrrolidone), poly(vinylbutyral), poly(styrenesulfonic acid), poly(2-acrylamido-2-methyl-1-propanesulfonic acid, polyacrylic acid, colloid-forming polymeric acids, and mixtures thereof.

In one embodiment, the new compositions are deposited to form electrically conductive or semiconductive layers which are used alone, or in combination with other electroactive materials, as electrodes, electroactive elements, photoactive elements, or bioactive elements. As used herein, the terms "electroactive element", "photoactive element" and "bioactive element" refer to elements which exhibit the named activity in response to a stimulus, such as an electromagnetic field, an electrical potential, solar energy radiation, and a biostimulation field.

In one embodiment, the new compositions are deposited to form buffer layers in an electronic device. The term "buffer layer" as used herein, is intended to mean an electrically conductive or semiconductive layer which can be used between an anode and an active organic material. A buffer layer is believed to accomplish one or more function in an organic electronic device, including, but not limited to planarization of the underlying layer, hole transport, hole injection, scavenging of impurities, such as oxygen and metal ions, among other aspects to facilitate or to improve the performance of an organic electronic device.

In one embodiment, there are provided buffer layers deposited from the new aqueous dispersion composition comprising polydioxythiophenes, colloid-forming polymeric acids, and a water-miscible organic liquid. In one embodiment, the buffer layers are deposited from aqueous dispersions comprising colloid-forming polymeric sulfonic acid. In one embodiment, the buffer layer is deposited from a new aqueous dispersion composition comprising fluorinated polymeric acid colloids. In another embodiment, the fluorinated polymeric acid colloids are fluorinated polymeric sulfonic acid colloids. In still another embodiment, the buffer layer is deposited from a new aqueous dispersion composition containing polydioxythiophene, perfluoroethylenesulfonic acid colloids, and a water-miscible organic liquid.

In another embodiment, there are provided electronic devices comprising at least one electrically conductive or semiconductive layer made from the new composition. Organic electronic devices that may benefit from having one or more layers made from the new composition include, but are not limited to, (1) devices that convert electrical energy into radiation (e.g., a light-emitting diode, light emitting diode display, or diode laser), (2) devices that detect signals through electronics processes (e.g., photodetectors (e.g., photoconductive cells, photoresistors, photoswitches, phototransistors, phototubes), IR detectors), (3) devices that convert radiation into electrical energy, (e.g., a photovoltaic device or solar cell), and (4) devices that include one or more electronic components that include one or more organic semi-conductor layers (e.g., a transistor or diode). Other uses for the new compositions include coating materials for memory storage devices, antistatic films, biosensors, electrochromic devices, solid electrolyte capacitors, energy storage devices such as a rechargeable battery, and electromagnetic shielding applications.

Figure 3:
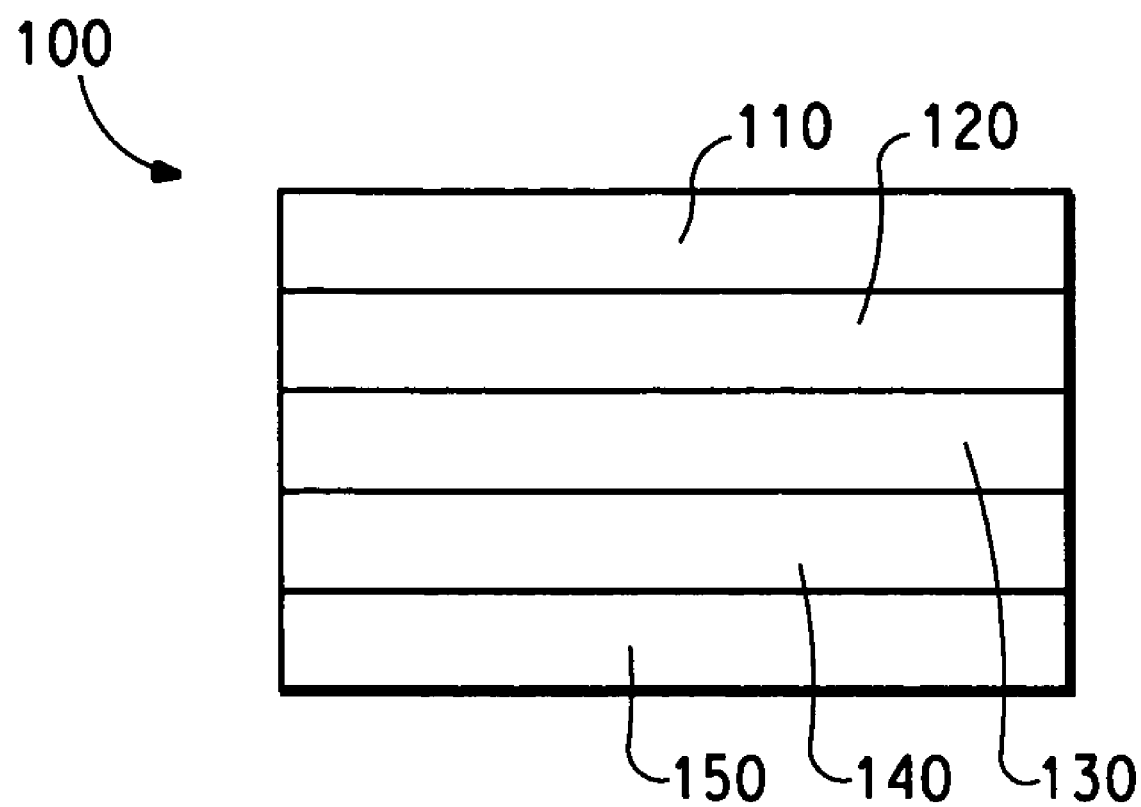
FIG. 3 illustrates a cross-sectional view of an one type of organic electronic device that includes a layer comprising the new composition, and in this illustration, the layer is a buffer layer in an organic light emitting diode.

In one embodiment, the organic electronic device comprises an electroactive layer positioned between two electrical contact layers, wherein at least one of the layers of the device includes the new buffer layer. One embodiment is illustrated in one type of OLED device, as shown in FIG. 3, which is a device that has anode layer 110, a buffer layer 120, an electroluminescent layer 130, and a cathode layer 150. Adjacent to the cathode layer 150 is an optional electron-injection/transport layer 140. Between the buffer layer 120 and the cathode layer 150 (or optional electron injection/transport layer 140) is the electroluminescent layer 130.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), aluminum-tin-oxide, gold, silver, copper, and nickel. The anode may also comprise an organic material such as polyaniline or polypyrrole. The IUPAC number system is used throughout, where the groups from the Periodic Table are numbered from left to right as 1-18 (CRC Handbook of Chemistry and Physics, 81$^{st}$ Edition, 2000).

The anode layer 110 may be formed by a variety of techniques including by a chemical or physical vapor deposition process or spin-coating process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

The anode layer 110 may be patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

The buffer layer 120 is deposited onto substrates using a variety of techniques well-known to those skilled in the art.

The electroluminescent (EL) layer 130 may typically be a fluorescing, phosphorescing materials (including organometallic complexes or conjugated polymer, such as poly (paraphenylenevinylene), abbreviated as PPV, or polyfluorene.) The particular material chosen may depend on the specific application, potentials used during operation, or other factors. The EL layer 130 containing the electroluminescent organic material can deposited using any deposition technique including vapor deposition, liquid processing or thermal transfer techniques. The EL organic materials can be applied directly by vapor deposition processes, depending upon the nature of the materials. In another embodiment, an EL polymer precursor can be applied and then converted to the polymer, typically by heat or other source of external energy (e.g., visible light or UV radiation).

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, metal-chelated oxinoid compounds (e.g., $Alq_3$ or the like); phenanthroline-based compounds (e.g., 2,9-dimethyl4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3, 4-oxadiazole ("PBD" or the like), 3-(4-biphenylyl)4-phenyl-5-(4-t-butylphenyl)-1,2,4-triazole ("TAZ" or the like); other similar compounds; or any one or more combinations thereof. Alternatively, optional layer 140 may be inorganic and comprise BaO, LiF, $Li_2O$, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

The cathode layer 150 is usually formed by a chemical or physical vapor deposition process. In general, the cathode layer will be patterned, as discussed above in reference to the anode layer 110. If the device lies within an array, the cathode layer 150 may be patterned into substantially parallel strips, where the lengths of the cathode layer strips extend in substantially the same direction and substantially perpendicular to the lengths of the anode layer strips. Electronic elements called pixels are formed at the cross points (where an anode layer strip intersects a cathode layer strip when the array is seen from a plan or top view).

In other embodiments, additional layer(s) may be present within organic electronic devices. For example, a layer (not shown) between the buffer layer 120 and the EL layer 130 may facilitate positive charge transport, band-gap matching of the layers, function as a protective layer, or the like. Similarly, additional layers (not shown) between the EL layer 130 and the cathode layer 150 may facilitate negative charge transport, band-gap matching between the layers, function as a protective layer, or the like. Layers that are known in the art can be used. In addition, any of the above-described layers can be made of two or more layers. Alternatively, some or all of inorganic anode layer 110, the buffer layer 120, the EL layer 130, and cathode layer 150, may be surface treated to increase charge carrier transport efficiency. The choice of materials for each of the component layers may be determined by balancing the goals of providing a device with high device efficiency with the cost of manufacturing, manufacturing complexities, or potentially other factors.

The different layers may have any suitable thickness. In one embodiment, inorganic anode layer 110 is usually no greater than approximately 500 nm, for example, approximately 10-200 nm; buffer layer 120, is usually no greater than approximately 250 nm, for example, approximately 50-200 nm; EL layer 130, is usually no greater than approximately 100 nm, for example, approximately 50-80 nm; optional layer 140 is usually no greater than approximately 100 nm, for example, approximately 20-80 nm; and cathode layer 150 is usually no greater than approximately 100 nm, for example, approximately 1-50 nm. If the anode layer 110 or the cathode layer 150 needs to transmit at least some light, the thickness of such layer may not exceed approximately 100 nm.

Depending upon the application of the electronic device, the EL layer 130 can be a light-emitting layer that is activated by signal (such as in a light-emitting diode) or a layer of material that responds to radiant energy and generates a signal with or without an applied potential (such as detectors or voltaic cells). After reading this specification, skilled artisans will be capable of selecting material(s) that are suitable for their particular applications. The light-emitting materials may be dispersed in a matrix of another material, with or without additives, and may form a layer alone. The EL layer 130 generally has a thickness in the range of approximately 50-500 nm. In one embodiment, EL layer 130 has a thickness no greater than approximately 200 nm.

Examples of other organic electronic devices that may benefit from having one or more layers comprising the aqueous dispersion polythiophenes made with polymeric acid colloids with adjusted conductivity include (1) devices that convert electrical energy into radiation (e.g., a light-emitting diode, light emitting diode display, or diode laser), (2) devices that detect signals through electronics processes (e.g., photodetectors (e.g., photoconductive cells, photoresistors, photoswitches, phototransistors, phototubes), IR detectors), (3) devices that convert radiation into electrical energy, (e.g., a photovoltaic device or solar cell), and (4) devices that include one or more electronic components that include one or more organic semi-conductor layers (e.g., a transistor or diode). Other uses for the materials of the invention include coating materials for antistatic layers, memory storage applications, biosensor applications, electrochromic, solid electrolyte capacitors, and electromagnetic shielding applications.

In yet another embodiment of the invention, there are provided thin film field effect transistors comprising electrodes comprising the new composition. In one embodiment the colloid-forming polymeric acid comprises colloid-forming polymeric sulfonic acids as counter anions for the electrically conducting polymers having adjusted conductivity. For use as electrodes in thin film field effect transistors, the new composition must be compatible with the other component materials in the transistor to avoid re-dissolution or re-dispersion of either conducting polymers or semiconducting polymers. Thin film field effect transistor electrodes fabricated from conducting polymers should have a conductivity greater than 10 S/cm. However, electrically conducting polymers made with water soluble polymeric acids only provide conductivity in the range of ~$10^{-3}$ S/cm or lower. Thus, in one embodiment, the electrodes comprise poly (alkylenedioxythiophene) and fluorinated colloid-forming polymeric sulfonic acids in combination with electrical conductivity enhancers such as metal nanowires, ,metal nanoparticles, carbon nanotubes, or the like. In still another embodiment, the electrodes comprise poly(3,4-ethylenedioxythiophene) and colloid-forming perfluoroethylenesulfonic acid in combination with electrical conductivity enhancers such as nanowires, carbon nanotubes, or the like. Invention compositions may be used in thin film field effect transistors as gate electrodes, drain electrodes, or source electrodes.

In another embodiment, there are provided field effect resistance devices comprising one layer made from the new composition. The field effect resistance device undergoes a reversible change of resistance in the conducting polymer films when subjected to a pulse of gate voltage, as illustrated in pages 339-343, No. 2, 2002, Current Applied Physics.

In another embodiment, there are provided electrochromic displays comprising at least one layer made from the new composition. Electrochromic displays utilize change of color when thin film of the material is subjected to electrical potential. In one embodiment electrically conductive polythiophene/polymeric acid colloids of the new composition are superior materials for this application because of the high pH of the dispersion, and the low moisture uptake and water non-dispersibility of dried solid films made from the dispersions.

In yet another embodiment, there are provided memory storage devices comprising silicon chips top-coated with the new composition. For example, a write-once-read-many-times (WORM) memory is known in the arts (Nature, Page 166 to 169, vol 426, 2003). When information is recorded, higher voltages at certain points in the circuit grids of silicon chips destroys the polythiophene at those points to create "zero" bit data. The polythiophene at the untouched points remains electrically conductive and becomes "1" bit data.

The invention will now be described in greater detail by reference to the following non-limiting examples.

EXAMPLES

Example 1

This example illustrates the addition of diethylene glycol to PEDOT/Nafion® at different weight ratios (WR) in a pH 4.1 aqueous dispersion, and its effect on conductivity.

The preparation of an aqueous PEDOT/Nafion® dispersion is described below. A 25% (w/w) aqueous colloidal dispersion of perfluororethylenesulfonic acid with an EW of 990 was made using a procedure similar to the procedure in U.S. Pat. No. 6,150,426, Example 1, Part 2, except that the temperature was approximately 270° C. The dispersion was diluted with water to form a 12.5% (w/w) dispersion for the polymerization.

471.3 g (57.13 mmoles of Nafion® monomer units) Nafion® aqueous colloidal dispersion, and 1689.5 g deionized water were massed into a 2000 ml jacketed three-necked round bottom flask. The mixture was stirred for 1 hr at a stirring speed of 425 rpm before the addition of ferric sulfate and sodium persulfate. A stock solution of ferric sulfate was made first by dissolving 0.0694 g ferric sulfate hydrate (97%, Aldrich cat. #30,771-8) with deionized water to a total weight of 20.9175 g. 7.93 g (0.0509 mmoles) of the ferric sulfate solution and 6.02 g (50.57 mmoles) sodium persulfate (Fluka, cat. # 71899) were then placed into the reaction flask while the mixture was being stirred. The mixture was then stirred for 3 minutes prior to addition of 2.2 ml (20.6 mmoles) of Baytron-M (a trade name for 3,4-ethyylenedioxythiophene H. C. Starck, LeverKusen, Germany) was added to the reaction mixture while stirring. The polymerization was allowed to proceed with stirring at about 20° C. controlled by circulation fluid. The polymerization liquid started to turn blue in 13 minutes. The reaction was terminated in 6 hours by adding 52.60 g Lewatit® S100, a trade name from Bayer, Pittsburgh, Pa., for sodium sulfonate of crosslinked polystyrene, and 54.57 g Lewatit® MP62 WS, a trade from Bayer, Pittsburgh, Pa., for free base/chloride of tertiary/quaternary amine of crosslinked polystyrene. The two resins were washed first before use with deionized water separately until there was no color in the water. The resin treatment proceeded for 5 hrs. The resulting slurry was then suction-filtered through a Whatman #4 filter paper. It went through the filter paper very fast. Total yield was 1532.4 g. Solid % was about 3.5% (w/w). pH was determined to be 4.1 using a Jenco Electronics Model 63 pH meter.

FIG. 1 shows film resistance vs. WR (weight ratio) for three different pH dispersions. In this example, pH is 4.1. WR is defined as solvent/polymer ratio (w/w). The chosen solvent was di-ethyleneglycol (DEG). Samples with different WRs were prepared by mixing 2 g of the dispersion prepared above, which contains 0.07 g PEDT/Nafion® in the dispersion. The 2 g dispersion was then mixed with 2 g DEG/water mixture. The amount of water was determined to be (2 g-0.07 g X) by a desired WR(X). Also for example, WR of 10 represents 17.5% (w/w) DEG in the mixture. A portion of each dispersion prepared as described was spin-coated on a cleaned optically flat quartz. Some films were dried at room temperature and tested (FIG. 1). Other films were heat-treated at 80° C. for 20 minutes (FIG. 2). Average thickness of the film was about 3 µm estimated by Dektak profilometer. The sheet resistance of a film was measured at 7 arbitrarily chosen spots by a standard 4-point probe. Mean values as well as errors by mean of standard deviation are shown in FIG. 1 along with the samples of pH 2.0 and pH 7.0. Graph 1 clearly shows that film resistance drops precipitously with a very small amount of DEG added to the dispersions. The graph also shows that DEG at 1.5 WR had the highest conductivity. The dispersion at 1.5 WR also has a much smoother surface based on Atomic Force Spectroscopy (AFM). FIG. 2 also shows that film resistance drops precipitously with a very small amount of DEG added to the dispersions and seems to reach a maximum conductivity at WR of about 1.

Example 2

This example illustrates the addition of di-ethyleneglycol to PEDT/Nafion® at different WR in a pH 2.0 aqueous dispersion, and its effect on conductivity.

402.8 g of the dispersion made in Example 1, which had a pH of 4.1, was adjusted to a lower pH by mixing with 29.7 g Dowex 550A (Dow Chemicals Company, Midland, Mich., USA), which is a base resin. The resin was washed with deionized water until there was no color. The resin containing dispersion was stirred for three hours and then filtered. The dispersion was then added with ~30 g acidic Amberlyst 15 (Rohm & Haas Company, Philadelphia, Pa., USA) and left stirred for one hour. It was then filtered. The filtered dispersion was added with another 15 g fresh Amberlyst 15 resin and then stirred for 1.5 hrs and filtered. It yielded 334 g. pH was determined to be 2.0. 168 g of the dispersion was kept for Example 3 below. The remaining portion was used for determining the effect of DEG on conductivity. Sample preparation of different weight ratio (WR) dispersions and thin films derived from them for conductivity measurement were conducted in the same manner as described in Example 1. As shown in FIG. 1 and FIG. 2, the highest conductivity occurred at WR of 1.5 although the data in FIG. 2 is more scattered. AFM also showed that the film derived from the dispersion of 1.5 WR had a much smoother surface.

Example 3

This example illustrates the addition of di-ethyleneglycol to PEDOT/Nafion® at different WR in a pH 7.0 aqueous dispersion, and its effect on conductivity.

168 g of the dispersion made in Example 2, which had a pH of 2.0, was adjusted to pH 7.0 by titration with a 0.4M sodium hydroxide solution. Sample preparation of different weight factor (WR) and thin films derived from them for conductivity measurement were conducted in the same manner as described in Example 1. As shown in FIG. 1 and FIG. 2, the highest conductivity was at WR of 1.5. AFM also shows that the film derived from the dispersion of 1.5 WR has a much smoother surface.

Example 4

This example illustrates the effect of N-methyl-2-pyrrolidinone (NMP) at 2, 5 and 10% (w/w) on film conductivity of PEDOT/Nafion® derived from a pH~2 aqueous dispersion:

The preparation of aqueous PEDOT/Nafion® dispersion is described below. The Nafion® used for the polymerization was the same as in Example 1.

63.89 g (8.07 mmoles of Nafion® monomer units) Nafion® aqueous colloidal dispersion, and 298.68 g deionized water were massed into a 500 ml jacketed three-necked round bottom flask. The mixture was stirred for 45 minutes at a stirring speed of 425 rpm before the addition of ferric sulfate and sodium persulfate. A stock solution of ferric sulfate was made first by dissolving 0.0135 g ferric sulfate hydrate (97%, Aldrich cat. #30,771-8) with deionized water to a total weight of 3.5095 g. 0.97 g (0.0072 mmoles) of the ferric sulfate solution and 0.85 g (7.14 mmoles) sodium persulfate (Fluka, cat. # 71899) were then placed into the reaction flask while the mixture was being stirred. The mixture was then stirred for 3 minutes prior to addition of 0.312 ml (2.928 mmoles) of Baytron-M (a trade name for 3,4-ethyylenedioxythiophene H. C. Starck, LeverKusen, Germany) was added to the reaction mixture while stirring. The polymerization was allowed to proceed with stirring at about 20° C. controlled by circulation fluid. The polymerization liquid started to turn blue in 13 minutes. The reaction was terminated in 19.7 hours by adding 8.97 g Lewatit® S100, a trade name from Bayer, Pittsburgh, Pa., for sodium sulfonate of crosslinked polystyrene, and 7.70 g Lewatit® MP62 WS, a trade from Bayer, Pittsburgh, Pa., for free base/chloride of tertiary/quaternary amine of crosslinked polystyrene. The two resins were washed first before use with deionized water separately until there was no color in the water. The resin treatment proceeded for 5 hrs. The resulting slurry was then suction-filtered through a Whatman #54 filter paper. It went through the filter paper very fast. Total yield was 273.73 g. Solid % was about 2.8%(w/w).

100.1 g dispersion made above, which had a pH of about 4, was adjusted to a lower pH by mixing with 1.07 g Dowex 550A, which is a base resin. The resin was washed with deionized water until there was no color. The resin containing dispersion was stirred for 12 hours and then filtered. The dispersion was then added with 2.5 g acidic Amberlyst 15 and left stirred for 9.5 hours. It was then filtered. The filtered dispersion was added with another 2.0 g fresh Amberlyst 15 resin and then stirred for 12 hrs and filtered. pH was determined to be ~2.0. Portion of the dispersion was used for experimenting effect of NMP on its conductivity. 2%, 5% and 10%(w/w) NMP in the ~2.8% acidified (pH~2) dispersion were prepared. The 2%, for example, represents 0.73 weight ratio of NMP to PEDT/Nafion®. Thin film preparation and conductivity measurement were carried out in the same manner as described above. Resistance of the film derived from the pH~2 dispersion without NMP was 2.2× $10^7$ Ω/square whereas the film resistance of films made with 2%, 5% and 10% NMP was 5×$10^5$ Ω/square, 1×$10^6$ Ω/square, and 5×$10^5$ Ω/square respectively. It can be clearly seen that resistance drops precipitously with a small percentage of NMP added to the pH~2 dispersion.

What is claimed is:

1. An aqueous dispersion comprising:
   water,
   a polydioxythiophene,
   a colloid-forming polymeric acid, and
   a water-miscible organic liquid,
wherein the organic liquid is added in an amount to increase the conductivity and the weight ratio of organic liquid to total polymer is in a range of from about 0.3 to 5.0.

2. The aqueous dispersion of claim 1, wherein the dispersion has a pH in the range of from about 1 to 8 and further comprises at least one selected from a conductive polymer, metal particles, graphite fibers, graphite particles, carbon nanotubes, carbon nanoparticles, metal nanowires, organic conductive inks, organic conductive pastes, inorganic conductive inks, inorganic conductive pastes, charge transport materials, semiconductive inorganic oxide nano-particles, insulating inorganic oxide nano-particles, piezoelectric oxide nano-particles, piezoelectric polymers, pyrroelectric oxide nano-particles, pyrroelectric polymers, ferroelectric oxide nano-particles, ferroelectric polymers, dispersing agents, crosslinking agents and combinations thereof.

3. The aqueous dispersion of claim 1, wherein at least one organic liquid has a boiling point greater than 100° C.

4. The aqueous dispersion of claim 1, wherein the organic liquid is selected from N-methylpyrrolidone, ethylene glycol, dimethylacetamide, dimethyl formamide, dimethylsulfoxide, and combinations thereof.

5. The aqueous dispersion of claim 4, wherein the organic liquid has a boiling point greater than 100° C.

6. The aqueous dispersion of claim 1, wherein the organic liquid comprises diethylene glycol.

7. The aqueous dispersion of claim 1, wherein the organic liquid comprises N-methylpyrrolidone.

8. The aqueous dispersion of claim 1, wherein the polydioxythiophene comprises poly(3,4-ethylenedioxythiophene).

9. The aqueous dispersion of claim 8, wherein the colloid-forming polymeric acid comprises a perfluoroalkylenesulfonic acid.

10. The aqueous dispersion of claim 1, wherein the colloid-forming polymeric acid comprises a perfluoroalkylenesulfonic acid.

11. The aqueous dispersion of claim 10, wherein the organic liquid is selected from N-methylpyrrolidone, ethylene glycol, diethylene glycol, dimethylacetamide, dimethyl formamide, dimethylsulfoxide, and combinations thereof.

* * * * *